United States Patent
Komiya et al.

(10) Patent No.: US 10,014,122 B2
(45) Date of Patent: Jul. 3, 2018

(54) PHOTOELECTRIC CONVERSION ELEMENT AND PHOTOELECTRIC CONVERSION ELEMENT MODULE

(75) Inventors: Ryoichi Komiya, Osaka (JP); Atsushi Fukui, Osaka (JP); Ryohsuke Yamanaka, Osaka (JP)

(73) Assignee: Sharp Kabushiki Kaisha, Osaka (JP)

( * ) Notice: Subject to any disclaimer, the term of this patent is extended or adjusted under 35 U.S.C. 154(b) by 371 days.

(21) Appl. No.: 14/124,788

(22) PCT Filed: Jun. 6, 2012

(86) PCT No.: PCT/JP2012/064527
§ 371 (c)(1),
(2), (4) Date: Dec. 9, 2013

(87) PCT Pub. No.: WO2012/169514
PCT Pub. Date: Dec. 13, 2012

(65) Prior Publication Data
US 2014/0096813 A1    Apr. 10, 2014

(30) Foreign Application Priority Data

Jun. 8, 2011   (JP) .................................. 2011-128075

(51) Int. Cl.
*H01G 9/20* (2006.01)
*H01L 51/00* (2006.01)

(52) U.S. Cl.
CPC .......... *H01G 9/209* (2013.01); *H01G 9/2068* (2013.01); *H01G 9/2081* (2013.01); *H01L 51/0086* (2013.01); *Y02E 10/542* (2013.01)

(58) Field of Classification Search
CPC .... H01G 9/209; H01L 51/0086; Y02E 10/542
See application file for complete search history.

(56) References Cited

U.S. PATENT DOCUMENTS

| 4,927,721 A | 5/1990 | Gratzel et al. |
| 5,084,365 A | 1/1992 | Gratzel et al. |

(Continued)

FOREIGN PATENT DOCUMENTS

| CN | 101540233 A | 9/2009 |
| EP | 2 348 570 | 7/2011 |

(Continued)

OTHER PUBLICATIONS

International Search Report for PCT/JP2012/064527, dated Jul. 17, 2012.

*Primary Examiner* — Sadie White
(74) *Attorney, Agent, or Firm* — Nixon & Vanderhye P.C.

(57) ABSTRACT

There are provided a photoelectric conversion element and a photoelectric conversion element module including the photoelectric conversion element, the photoelectric conversion element including a transparent substrate, a transparent conductive layer arranged on the transparent substrate, a photoelectric conversion layer arranged on the transparent conductive layer, a porous insulating layer arranged in contact with the photoelectric conversion layer, a reflective layer arranged in contact with the porous insulating layer, and a catalyst layer and a counter conductive layer that are arranged on the reflective layer, in which the photoelectric conversion layer contains a porous semiconductor, a carrier-transport material, and a photosensitizer, and in which the area of the orthogonal projection of the porous insulating layer onto the transparent substrate and the area of the orthogonal projection of the reflective layer onto the transparent substrate are each larger than the area of the orthogonal projection of the photoelectric conversion layer onto the transparent substrate.

12 Claims, 1 Drawing Sheet

(56) References Cited

U.S. PATENT DOCUMENTS

| | | | | |
|---|---|---|---|---|
| 6,069,313 A | * | 5/2000 | Kay | H01G 9/2031 |
| | | | | 136/244 |
| 2011/0197948 A1 | * | 8/2011 | Kobayashi | H01G 9/2036 |
| | | | | 136/244 |
| 2012/0042930 A1 | | 2/2012 | Yamanaka et al. | |
| 2012/0048337 A1 | * | 3/2012 | Fukui | H01G 9/2031 |
| | | | | 136/244 |

FOREIGN PATENT DOCUMENTS

| | | | | |
|---|---|---|---|---|
| JP | 2664194 | | 6/1997 | |
| JP | 11-514787 | | 12/1999 | |
| JP | 2000-348784 | | 12/2000 | |
| JP | 20003-48784 A | | 12/2000 | |
| JP | 2001-357897 | | 12/2001 | |
| JP | 2002-367686 | | 12/2002 | |
| JP | 2010-262760 | | 11/2010 | |
| JP | 2010-262760 A | | 11/2010 | |
| WO | 2010/044445 A1 | | 4/2010 | |
| WO | WO 2010/044445 | | 4/2010 | |
| WO | WO 2010044445 A1 | * | 4/2010 | H01G 9/2036 |
| WO | WO 2010/119775 | | 10/2010 | |
| WO | WO 2010125929 A1 | * | 11/2010 | H01G 9/2031 |

* cited by examiner

PHOTOELECTRIC CONVERSION ELEMENT AND PHOTOELECTRIC CONVERSION ELEMENT MODULE

This application is the U.S. national phase of International Application No. PCT/JP2012/064527 filed 6 Jun. 2012 which designated the U.S. and claims priority to JP Patent Application No. 2011-128075 filed Jun. 8, 2011, the entire contents of each of which are hereby incorporated by reference.

TECHNICAL FIELD

The present invention relates to a photoelectric conversion element and a photoelectric conversion element module.

BACKGROUND ART

Solar cells capable of converting sunlight into electric power have been receiving attention as energy sources to replace fossil fuels. Nowadays, solar cells including crystalline silicon substrates and thin-film silicon solar cells are practically used. However, the former solar cells have the problem of high production costs of silicon substrates. The latter thin-film solar cells have the problem of high production costs due to the need to use various types of gases for use in the production of semiconductors and complicated devices. Thus, in any type of solar cell, continuing efforts have been made to reduce the cost per power output by improving photoelectric conversion efficiency. However, the foregoing problems have not yet been solved.

For example, Japanese Patent No. 2664194 (PTL 1) reports, as a new type of solar cell, a photoelectric conversion element on the basis of photoinduced electron transfer in a metal complex. The structure of the photoelectric conversion element is as follows: A photoelectric conversion layer on which a photosensitizing dye adsorbs to have an absorption spectrum in the visible light region and an electrolytic solution are held between two glass substrates. A first electrode and a second electrode are arranged on respective surfaces of the two glass substrates.

The irradiation with light from the first electrode side generates electrons in the photoelectric conversion layer. The generated electrons are transferred from the first electrode to the opposite second electrode through an external electric circuit. The transferred electrons are transported by ions in an electrolyte and return to the photoelectric conversion layer. Electric energy can be taken from the successive transfer of electrons.

The photoelectric conversion element described in PTL 1 has a structure in which a gap between the two glass substrates is filled with the electrolytic solution. Thus, prototype solar cells with small areas can be produced. However, it is difficult to produce a large-area solar cell, for example, a 1 m×1 m square solar cell. That is, in the case of increasing the area of a solar cell, a generation current increases with increasing area. However, the in-plane resistance of the first electrode is increased to increase internal series resistance as a solar cell. This disadvantageously leads to a decrease in fill factor (FF) in current-voltage characteristics during photoelectric conversion.

As attempts to overcome the foregoing problem, for example, Japanese Unexamined Patent Publication (Translation of PCT Application) No. 11-514787 (PTL 2), Japanese Unexamined Patent Application Publication No. 2001-357897 (PTL 3), and Japanese Unexamined Patent Application Publication No. 2002-367686 (PTL 4) report photoelectric conversion element modules each including a plurality of photoelectric conversion elements connected in series. In each of the photoelectric conversion element modules, the increase in internal series resistance is inhibited by electrically connecting an electrode (conductive layer) of the photoelectric conversion element to an electrode (counter conductive layer) of an adjacent photoelectric conversion element.

FIG. 3 is a schematic cross-sectional view of the structure of a conventional photoelectric conversion element. In a conventional photoelectric conversion element 40, a transparent conductive layer 42 is arranged on a transparent substrate 41 as illustrated in FIG. 3. A laminate is arranged on the transparent conductive layer 42, the laminate including a porous semiconductor 43 on which a dye adsorbs, a reflective layer 45, a porous insulating layer 44, a catalyst layer 46, and a counter conductive layer 47 stacked in that order. The transparent substrate 41 and the supporting substrate 48 are fixed with a sealing member 49 in such a manner that a supporting substrate 48 is arranged above the counter conductive layer 47. The laminate is sealed with the transparent substrate 41, the supporting substrate 48, and the sealing member 49. A space in the photoelectric conversion element 40 is filled with a carrier-transport material 51.

In the conventional photoelectric conversion element illustrated in FIG. 3, a material constituting the reflective layer 45 is different from that of the porous insulating layer 44. Thus, delamination is liable to occur between the reflective layer 45 and the porous insulating layer 44. Furthermore, the reflective layer 45 is formed of fine grains having a relatively large size of 100 nm or more and thus has insufficient layer strength. Thus, the delamination is liable to occur between the reflective layer 45 and the porous insulating layer 44.

In Japanese Unexamined Patent Application Publication No. 2010-262760 (PTL 5), the stacking sequence of the porous semiconductor, the reflective layer, and the porous insulating layer is changed in order to prevent the delamination between the reflective layer and the porous insulating layer. The change in stacking sequence inhibits delamination that is liable to occur between layers, thereby producing the photoelectric conversion element in high yield.

CITATION LIST

Patent Literature

PTL 1: Japanese Patent No. 2664194
PTL 2: Japanese Unexamined Patent Publication (Translation of PCT Application) No. 11-514787
PTL 3: Japanese Unexamined Patent Application Publication No. 2001-357897
PTL 4: Japanese Unexamined Patent Application Publication No. 2002-367686
PTL 5: Japanese Unexamined Patent Application Publication No. 2010-262760

SUMMARY OF INVENTION

Technical Problem

In the photoelectric conversion element described in PTL 5, it is possible to prevent the delamination between layers. However, the reflective layer is not arranged in the direction of a side surface of the photoelectric conversion layer because of the fact that the porous insulating layer is arranged between the photoelectric conversion layer and the reflective layer and that the reflective layer is arranged just in the same shape as the photoelectric conversion layer. Thus, the light-scattering effect of the reflective layer is not sufficiently provided, thereby disadvantageously reducing the photoelectric conversion efficiency of the photoelectric conversion element.

The present invention has been accomplished in light of the foregoing circumstances. It is an object of the present invention to provide a photoelectric conversion element having high photoelectric conversion efficiency and a photoelectric conversion element module by suppressing the fact that a porous insulating layer inhibits the light-scattering effect of a reflective layer and by improving the scattering effect of light from the direction of the side surface.

Solution to Problem

To overcome the foregoing problems, the inventors have conducted intensive studies and have found that, in a photoelectric conversion element and a photoelectric conversion element module, it is possible to improve the light-scattering effect of a reflective layer by forming the reflective layer having a larger projected area onto a transparent substrate than a porous semiconductor. This finding has led to the completion of the present invention.

A photoelectric conversion element of the present invention includes a transparent substrate, a transparent conductive layer arranged on the transparent substrate, a photoelectric conversion layer arranged on the transparent conductive layer, a porous insulating layer arranged in contact with the photoelectric conversion layer, a reflective layer arranged in contact with the porous insulating layer, and a catalyst layer and a counter conductive layer that are arranged on the reflective layer, in which the photoelectric conversion layer contains a porous semiconductor, a carrier-transport material, and a photosensitizer, and in which the area of the orthogonal projection of the porous insulating layer onto the transparent substrate and the area of the orthogonal projection of the reflective layer onto the transparent substrate are each larger than the area of the orthogonal projection of the photoelectric conversion layer onto the transparent substrate.

The porous insulating layer is preferably arranged in contact with an upper portion of the photoelectric conversion layer. The reflective layer is preferably arranged in contact with an upper portion of the porous insulating layer. The porous insulating layer preferably has a thickness of 0.2 µm or more and 5 µm or less. The total thickness of the porous insulating layer and the reflective layer is preferably 10 µm or more.

The porous insulating layer is preferably composed of a material having an electrical conductivity of $1 \times 10^{12}$ Ω·cm or less. The porous insulating layer is preferably composed of one or more compounds selected from the group consisting of niobium oxide, zirconium oxide, silicon oxide compounds, aluminum oxide, and barium titanate.

The reflective layer preferably contains aluminum oxide or titanium oxide. The reflective layer is preferably composed of a material identical to a material constituting the porous semiconductor. The reflective layer and the porous semiconductor are preferably composed of titanium oxide. The reflective layer is preferably formed of fine particles having an average particle size larger than the average particle size of fine particles constituting the porous semiconductor.

The present invention provides a photoelectric conversion element module including two or more photoelectric conversion elements electrically connected in series, in which at least one of the photoelectric conversion elements is the photoelectric conversion element of the present invention.

The present invention provides a photoelectric conversion element module including three or more photoelectric conversion elements electrically connected in series and/or parallel, in which at least one of the photoelectric conversion elements is the photoelectric conversion element of the present invention.

The present invention provides a photoelectric conversion element module including two or more photoelectric conversion elements electrically connected in series and/or parallel, in which each of the photoelectric conversion elements is the photoelectric conversion element of the present invention.

Advantageous Effects of Invention

According to the present invention, a photoelectric conversion element having high photoelectric conversion efficiency and a photoelectric conversion element module are provided by improving the light-scattering effect of a reflective layer.

DESCRIPTION OF EMBODIMENTS

Figure 1:
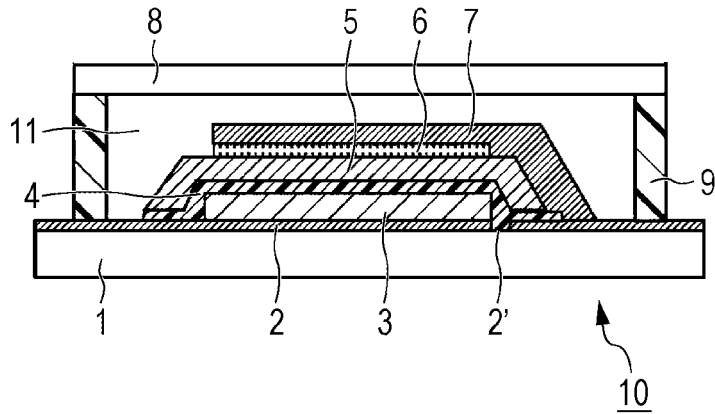
FIG. 1 is a schematic cross-sectional view of an example of the structure of a photoelectric conversion element of the present invention.

A photoelectric conversion element and a photoelectric conversion element module of the present invention will be described below with respect to the drawings. In the drawings of the present invention, the same or equivalent portions are designated using the same reference numerals. The dimensions, such as length, width, and depth, are appropriately changed for clarification and simplification of the drawings and do not represent actual dimensions.

<Photoelectric Conversion Element>

FIG. 1 is a schematic cross-sectional view of an example of the structure of a photoelectric conversion element of the present invention. As illustrated in FIG. 1, a photoelectric conversion element 10 of the present invention includes a transparent substrate 1, a transparent conductive layer 2 on the transparent substrate 1, a photoelectric conversion layer 3 on the transparent conductive layer 2, a porous insulating layer 4 in contact with the photoelectric conversion layer 3, a reflective layer 5 in contact with the porous insulating layer 4, and a catalyst layer 6 on the reflective layer 5. The photoelectric conversion layer 3 contains a porous semiconductor, a carrier-transport material, and a photosensitizer. The area of the orthogonal projection of the porous insulating layer 4 onto the transparent substrate 1 and the area of the orthogonal projection of the reflective layer 5 onto the transparent substrate 1 are each larger than the area of the orthogonal projection of the photoelectric conversion layer 3 onto the transparent substrate 1. This structure improves the light-scattering effect of the reflective layer 5 to increase the photoelectric conversion efficiency of the photoelectric conversion element.

The carrier-transport material is filled into gaps among the porous insulating layer 4, the reflective layer 5, and the catalyst layer 6 in addition to the photoelectric conversion layer 3. A counter conductive layer 7 is arranged on the catalyst layer 6. The transparent substrate 1 and a supporting substrate 8 are fixed with a sealing member 9. The transparent conductive layer 2 is partially broken. The broken portion is referred to as a scribe line 2'. Hereinafter, components included in the photoelectric conversion element 10 of the present invention will be described.

<<Transparent Substrate>>

In the present invention, at least a light-receiving surface of the transparent substrate 1 needs to have optical transparency, so the transparent substrate 1 needs to be composed of an optically transparent material. However, the transparent substrate 1 need not necessarily transmit all light having any wavelength and may be composed of a material substantially transparent to light having a wavelength effectively sensitive to a dye, as described below. The transparent substrate 1 preferably has a thickness of about 0.2 to about 5 mm.

A material for the transparent substrate 1 is not particularly limited as long as it is commonly used for solar cells. For example, glass substrates composed of soda-lime glass, fused silica glass, crystalline silica glass, and so forth and heat-resistant resin sheets, such as flexible films, may be used. With respect to flexible films, tetraacetylcellulose (TAC), polyethylene terephthalate (PET), polyphenylene sulfide (PPS), polycarbonate (PC), polyarylate (PA), polyetherimide (PEI), phenoxy resins, and Teflon (registered trademark) are exemplified.

In the case where another member is formed on the transparent substrate 1 under heating, in other words, for example, in the case where the photoelectric conversion layer 3 composed of a porous semiconductor is formed on the transparent substrate under heating at about 250° C., Teflon (registered trademark) is preferably used as the transparent substrate 1 because Teflon (registered trademark) has a heat resistance of 250° C. or higher. The transparent substrate 1 may be used as a base that serves to be attached to another structure. That is, the transparent substrate 1 may be easily attached to another structure at its periphery with a machined metal part and a screw.

<<Transparent Conductive Layer>>

In the present invention, the transparent conductive layer 2 may be composed of a material that substantially transmits light having a wavelength effectively sensitive to a photosensitizer described below. The transparent conductive layer 2 need not necessarily transmit all light having any wavelength. Examples of the material include complex indium tin oxide (ITO), tin oxide ($SnO_2$), fluorine-doped tin oxide (FTO), zinc oxide (ZnO), and titanium oxide doped with tantalum or niobium.

The transparent conductive layer 2 may be formed on the transparent substrate 1 by a known method, for example, a sputtering method or a spray method. The transparent conductive layer 2 has a thickness of about 0.02 to about 5 μm. The transparent conductive layer 2 preferably has a lower resistance and more preferably has a resistance of 40 Ω/sq or less.

In the case where the transparent substrate 1 composed of soda-lime float glass is used, the transparent conductive layer 2 composed of FTO is preferably stacked on the transparent substrate 1. A commercially available transparent substrate 1 provided with a transparent conductive layer 2 may be used.

<<Photoelectric Conversion Layer>>

In the present invention, the photoelectric conversion layer 3 contains the porous semiconductor, the carrier-transport material, and the photosensitizer, the photosensitizer being adsorbed on the porous semiconductor. In the photoelectric conversion layer 3 having such a structure, the carrier-transport material can move inside and outside the layer.

(Porous Semiconductor)

The type of the porous semiconductor contained in the photoelectric conversion layer 3 is not particularly limited as long as it is commonly used for a photoelectric conversion material. Examples of the porous semiconductor that may be used include semiconductors, such as titanium oxide, zinc oxide, tin oxide, iron oxide, niobium oxide, cerium oxide, tungsten oxide, barium titanate, strontium titanate, cadmium sulfide, lead sulfide, zinc sulfide, indium phosphide, copper-indium sulfide ($CuInS_2$), $CuAlO_2$, and $SrCu_2O_2$, and combinations thereof. Among these compounds, titanium oxide is particularly preferred in view of stability and safety.

Examples of titanium oxide suitably used for the porous semiconductor include anatase titanium oxide, rutile titanium oxide, amorphous titanium oxide, various titanium oxides, such as metatitanic acid and orthotitanic acid, in a narrow sense, titanium hydroxide, and hydrous titanium oxide. These compounds may be used separately or in combination of two or more as a mixture. With respect to the two types of crystalline titanium oxide, anatase and rutile, the structure depends on the production process and the heat history. As the titanium oxide contained in the porous semiconductor, a higher anatase titanium oxide content is preferred. An anatase titanium oxide content of 80% or more is more preferred.

The porous semiconductor may be monocrystalline or polycrystalline. The porous semiconductor is preferably polycrystalline in view of stability, ease of crystal growth, production cost, and so forth. The porous semiconductor is preferably formed of nano- to micro-scale semiconductor fine particles. Titanium oxide fine particles are more preferably used. Titanium oxide fine particles may be produced by a known method, for example, a gas-phase method, a liquid-phase method (hydrothermal synthesis and a sulfuric acid method). Furthermore, titanium oxide fine particles may be produced by high-temperature hydrolysis of a chloride, developed by Degussa.

As the semiconductor fine particles contained in the porous semiconductor, a semiconductor compound having a uniform composition may be used. Alternatively, a mixture of two or more semiconductor compounds having different compositions may be used. With respect to the particle size of the semiconductor fine particles, the semiconductor fine particles having an average particle size of about 100 to about 500 nm may be used. The semiconductor fine particles having an average particle size of about 5 nm to about 50 nm may also be used. Alternatively, a mixture of these semiconductor fine particles may be used. The semiconductor fine particles having a particle size of about 100 to about 500 nm seemingly contribute to the scattering of incident light to improve light-harvesting efficiency. The semiconductor fine particles having an average particle size of about 5 nm to about 50 nm seemingly contribute to an increase in the number of adsorption sites to improve the amount of dye adsorbed.

In the case where the porous semiconductor is formed of a mixture of two or more types of semiconductor fine particles having different particle sizes, the average particle size of the semiconductor fine particles having a smaller particle size is preferably 10 or more times that of the semiconductor fine particles having a larger particle size. In the case where the mixture of two or more types of semiconductor fine particles is used, it is effective to use a semiconductor compound having a strong adsorption effect in the form of semiconductor fine particles having a small particle size.

The thickness of the porous semiconductor, i.e., the thickness of the photoelectric conversion layer 3, is not particularly limited. For example, the photoelectric conversion layer 3 preferably has a thickness of about 0.1 to about 100 μm. The porous semiconductor preferably has a large surface area of, for example, about 10 to 200 $m^2/g$.

(Photosensitizer)

The photosensitizer that is adsorbed on the porous semiconductor is arranged to convert the energy of light incident on the photoelectric conversion element into electric energy. To allow the photosensitizer to adsorb firmly on the porous semiconductor, the photosensitizer preferably contains an interlocking group in its molecule. In general, the interlocking group refers to a group that intervenes when a dye is fixed to the porous semiconductor and provides an electrical coupling to facilitate electron transfer between the dye in an excited state and a conduction band of the semiconductor. Specific examples thereof include functional groups, such as a carboxyl group, an alkoxy group, a hydroxyl group, a sulfonic group, an ester group, a mercapto group, and a phosphonyl group.

As the photosensitizer adsorbed on the porous semiconductor, for example, various organic dyes and metal complex dyes that have absorption in the visible light region and the infrared region may be used. These dyes may be used separately or in combination of two or more. In general, extinction coefficients of organic dyes are larger than those of metal complex dyes described below.

Examples of the organic dyes include azo dyes, quinone dyes, quinonimine dyes, quinacridone dyes, squarylium dyes, cyanine dyes, merocyanine dyes, triphenylmethane dyes, xanthene dyes, porphyrin dyes, perylene dyes, indigo dyes, and naphthalocyanine dyes.

The metal complex dyes are compounds each having a structure in which a transition metal is coordinated to a metal atom. Examples of such metal complex dyes include porphyrin-based dyes, phthalocyanine-based dyes, naphthalocyanine-based dyes, and ruthenium-based dyes. Examples of the metal atom contained in the metal complex dyes include Cu, Ni, Fe, Co, V, Sn, Si, Ti, Ge, Cr, Zn, Ru, Mg, Al, Pb, Mn, In, Mo, Y, Zr, Nb, Sb, La, W, Pt, Ta, Ir, Pd, Os, Ga, Tb, Eu, Rb, Bi, Se, As, Sc, Ag, Cd, Hf, Re, Au, Ac, Tc, Te, and Rh. Specifically, phthalocyanine-based dyes and Ruthenium-based metal complex dyes are preferred. Ruthenium-based metal complex dyes are particularly preferred.

In particular, ruthenium-based metal complex dyes represented by formulae (1) to (3) are preferred. Examples of commercially available ruthenium-based metal complex dyes include Ruthenium 535 dye, Ruthenium 535-bisTBA dye, and Ruthenium 620-1H3TBA dye, which are trade names and manufactured by Solaronix.

[Chem. 1]

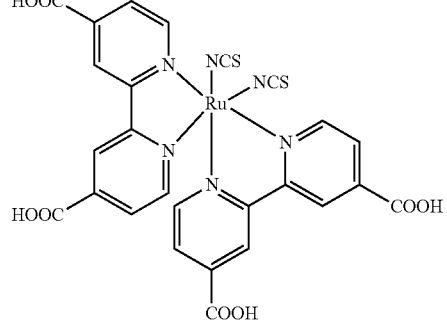

(1)

[Chem. 2]

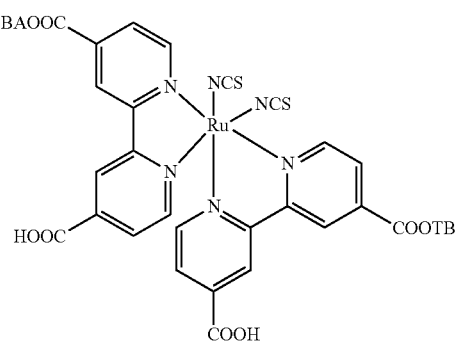

(2)

[Chem. 3]

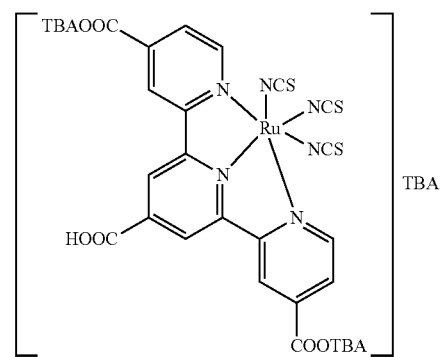

(3)

<<Carrier-Transport Material>>

In the present invention, all spaces and gaps in the photoelectric conversion element 10 illustrated in FIG. 1 are filled with the carrier-transport material. In other words, a carrier-transport material 11 is contained in a region surrounded by the transparent conductive layer 2, the supporting substrate 8, and the sealing member 9 as illustrated in FIG. 1. Furthermore, gaps among the photoelectric conversion layer 3, the porous insulating layer 4, the reflective layer 5, and the catalyst layer 6 are also filled with the carrier-transport material. In this specification, for convenience sake, the carrier-transport material 11 indicates a region that does not include another component and that is filled with only the carrier-transport material.

The carrier-transport material is composed of a conductive material capable of transporting ions. Examples of the conductive material that may be suitably used include liquid electrolytes, solid electrolytes, gel electrolytes, and molten-salt gel electrolytes.

The liquid electrolytes may be liquid materials containing redox species. Any liquid electrolyte that is commonly used in the field of solar cells may be used without any particular limitation. Examples of the liquid electrolyte that may be used include a liquid electrolyte containing a redox species and a solvent capable of dissolving the redox species, a liquid electrolyte containing a redox species and a molten salt capable of dissolving the redox species, and a liquid electrolyte containing a redox species, a solvent, and a molten salt, the solvent and the molten salt being capable of dissolving the redox species.

Examples of the redox species include an $I^-/I^{3-}$ system, a $Br^{2-}/Br^{3-}$ system, an $Fe^{2+}/Fe^{3+}$ system, and a quinone/hydroquinone system. Specific preferred examples thereof include combinations of iodine ($I_2$) with a metal iodide, e.g., lithium iodide (LiI), sodium iodide (NaI), potassium iodide (KI), or calcium iodide ($CaI_2$); combinations of iodine with a tetraalkylammonium salt, e.g., tetraethylammonium iodide (TEAI), tetrapropylammonium iodide (TPAI), tetrabutylammonium iodide (TBAI), or tetrahexylammonium iodide (THAI); and combinations of bromine with a metal bromide, e.g., lithium bromide (LiBr), sodium bromide (NaBr), potassium bromide (KBr), or calcium bromide ($CaBr_2$). Among these compounds, the combination of $I_2$ with LiI is particularly preferred.

Examples of a solvent for the redox species include carbonate compounds, such as propylene carbonate; nitrile compounds, such as acetonitrile; alcohols, such as ethanol; water; and aprotic polar substances. Among these compounds, carbonate compounds and nitrile compounds are particularly preferred. These solvents may also be used in combination of two or more as a mixture.

The solid electrolytes may be conductive materials which are capable of transporting electrons, holes, and ions, which can be used as electrolytes for solar cells, and which have no flowability. Specific examples thereof include hole-transport materials, such as polycarbazole; electron-transport materials, such as tetranitrofluorenone; conductive polymers, such as polylol; polyelectrolytes prepared by solidifying liquid electrolytes with macromolecular compounds; p-type semiconductors, such as copper iodide and copper thiocyanate; and electrolytes prepared by solidifying liquid electrolytes containing molten salts with fine particles.

The gel electrolytes are each composed of an electrolyte and a gelling agent, in general. Examples of the gelling agent include organic gelling agents, such as cross-linked polyacrylic resin derivatives, cross-linked polyacrylonitrile derivatives, polyalkylene oxide derivatives, silicone resins, and polymers each having a nitrogen-containing heterocyclic quaternary compound salt structure in a side chain.

Usually, the molten-salt gel electrolytes are each composed of the foregoing gel electrolyte and an ambient temperature molten salt. Examples of the ambient-temperature molten salt include nitrogen-containing heterocyclic quaternary ammonium salt compounds, such as pyridinium salts and imidazolium salts.

The foregoing electrolyte may contain an additive as needed. Examples of the additive include nitrogen-containing aromatic compounds, such as tert-butylpyridine (TBP); and imidazole salts, such as dimethylpropylimidazole iodide (DMPII), methylpropylimidazole iodide (MPII), ethylmethylimidazole iodide (EMII), ethylimidazole iodide (EII), and hexylmethylimidazole iodide (HMII).

An electrolyte concentration in the electrolyte preferably is preferably in the range of 0.001 mol/L or more and 1.5 mol/L or less and more preferably 0.01 mol/L or more and 0.7 mol/L or less. In the case where the supporting substrate 8 serves as a light-receiving surface in a dye-sensitized solar cell module, incident light reaches the photoelectric conversion layer 3 through an electrolytic solution to excite carriers. This may cause a reduction in the performance of the solar cell, depending on the electrolyte concentration. Thus, the electrolyte concentration is preferably set in view of this factor.

<<Porous Insulating Layer>>

In the present invention, the porous insulating layer 4 is arranged in contact with the photoelectric conversion layer 3. The porous insulating layer 4 reduces a leakage current from the photoelectric conversion layer 3 to the counter conductive layer 7. The porous insulating layer is preferably arranged in contact with an upper portion and side surfaces of the photoelectric conversion layer 3. This is because by arranging the porous insulating layer so as to cover the upper portion and the side surfaces of the photoelectric conversion layer 3 as described above, the leakage current from the photoelectric conversion layer 3 is reduced.

Examples of a material contained in the porous insulating layer 4 include niobium oxide, zirconium oxide, silicon oxide, such as silica glass and soda glass, aluminum oxide, and barium titanate. These materials may be used separately or in combination of two or more. The material used for the porous insulating layer 4 is preferably in the form of particles. The average particle size thereof is preferably 5 to 500 nm and more preferably 10 to 300 nm. Titanium oxide or rutile titanium oxide having a particle size of 100 nm to 500 nm may be preferably used.

The porous insulating layer 4 is preferably composed of a material having an electrical conductivity of $1\times10^{12}$ Ω·cm or less. A lower electrical conductivity is more preferred. The use of the material having an electrical conductivity as described above results in a reduction in the leakage current from the photoelectric conversion layer 3 to the counter conductive layer 7. If the porous insulating layer 4 is composed of a material having an electrical conductivity of more than $1\times10^{12}$ Ω·cm, the leakage current flows easily to reduce the fill factor and so forth. This leads to a reduction in photoelectric conversion efficiency, which is not preferred.

The porous insulating layer 4 preferably has a thickness of 0.2 μm or more and 5 μm or less and more preferably 0.5 μm or more and 2 μm or less. A thickness of the porous insulating layer 4 of more than 5 μm is not preferred because the light-scattering effect of the reflective layer is inhibited to reduce a short-circuit current (Jsc). A thickness of the porous insulating layer 4 of less than 0.2 μm is not preferred because the leakage current is easily generated.

<<Reflective Layer>>

In the present invention, the reflective layer 5 is arranged on the porous insulating layer 4. The reflective layer 5 can reflect light passing through the photoelectric conversion layer 3 and allow the reflected light to enter the photoelectric conversion layer 3 again. In this way, the entrance of light reflected from the photoelectric conversion layer 3 enables the photoelectric conversion efficiency to increase. The reflective layer 5 is preferably arranged so as to be in contact with an upper portion of the porous insulating layer 4 and so as to have a larger area than that required to cover the photoelectric conversion layer. More preferably, the reflective layer 5 is arranged on the upper surface of the porous insulating layer 4 so as to have the same shape as the porous insulating layer 4. As described above, the reflective layer 5 is arranged so as to cover the entire surface of the porous insulating layer; hence, the reflective layer 5 can reflect light passing through the photoelectric conversion layer 3 to allow the light to enter the photoelectric conversion layer again.

The reflective layer 5 may be composed of any material capable of reflecting transparent light. Examples of the material that may be used include titanium oxide, aluminum oxide, and barium titanate. Among these materials, the reflective layer 5 more preferably contains aluminum oxide or titanium oxide. Still more preferably, the reflective layer 5 is composed of a material identical to that constituting the porous semiconductor.

In the reflective layer 5, a higher proportion of fine particles having an average particle size larger than the fine particles constituting the porous semiconductor is preferred. More preferably, the reflective layer 5 is formed of only fine particles having an average particle size larger than the fine particles constituting the porous semiconductor. The reflective layer 5 preferably has a thickness of 5 μm or more. A thickness of the reflective layer 5 of less than 5 μm results in a reduction in the reflectance of light and, in addition, is more likely to bring the catalyst layer and the counter conductive layer arranged on the reflective layer into contact with the porous semiconductor or a transparent electrode layer, which is not preferred.

Here, the total thickness of the porous insulating layer and the reflective layer is preferably 10 μm or more and more preferably 11 μm or more and 20 μm or less. A total thickness of the porous insulating layer and the reflective layer of less than 10 μm is not preferred because the catalyst layer and the counter conductive layer arranged on the reflective layer are more likely to come into contact with the porous semiconductor or a transparent electrode layer. A total thickness of the porous insulating layer and the reflective layer of more than 20 μm is not preferred because the transport resistance of the carrier-transport material is increased. In the case where the reflective layer is arranged on the porous insulating layer and where the total thickness thereof is within the above range, the effect of an insulating layer to inhibit leakage is imparted to the reflective layer.

<<Catalyst Layer>>

In the present invention, the catalyst layer 6 is arranged in contact with the counter conductive layer 7. The presence of the catalyst layer 6 provides the efficient transfer of electrons from the counter conductive layer 7. Any material may be used for the catalyst layer 6 without any particular limitation as long as the material can transfer electrons on a surface thereof. Examples thereof include noble metals, such as platinum and palladium; and carbonaceous materials, such as carbon black, Ketjenblack, carbon nanotubes, and fullerenes.

<<Counter Conductive Layer>>

In the present invention, the counter conductive layer 7 is not particularly limited as long as it is conductive. The counter conductive layer 7 may not necessarily be optically transparent. However, in the case where the supporting substrate 8 serves as a light-receiving surface, the counter conductive layer 7 needs to be optically transparent, as with the transparent conductive layer.

As a material contained in the counter conductive layer, 7, for example, complex indium tin oxide (ITO), tin oxide ($SnO_2$), fluorine-doped tin oxide (FTO), or zinc oxide (ZnO) (ITO) may be used. Alternatively, a metal that is not corroded by the electrolytic solution, for example, titanium, nickel, or tantalum, may be used. The counter conductive layer 7 composed of such a material may be formed by a known method, for example, a sputtering method or a spray method.

The counter conductive layer 7 preferably has a thickness of about 0.02 μm to about 5 μm. A lower resistance of the counter conductive layer 7 is better. The counter conductive layer 7 preferably has a resistance of 40 Ω/sq or less. In the case where a material constituting the counter conductive layer 7 has a dense structure, a plurality of pores are preferably formed in the counter conductive layer 7 in order to facilitate the adsorption of the photosensitizer and facilitate the passage of the carrier-transport material.

The counter conductive layer 7 may be subjected to physical contact or laser processing to form the pores. The size of each of the pores is preferably in the range of about 0.1 to about 100 μm and more preferably about 1 to about 50 μm. The distance between the pores is preferably in the range of about 1 to about 200 μm and more preferably about 10 to about 300 μm. The same effect is provided by forming stripe-shaped opening portions in the counter conductive layer 7. The distance between the stripe-shaped opening portions is preferably in the range of about 1 μm to about 200 μm and more preferably about 10 μm to about 300 μm.

<<Supporting Substrate>>

In the present invention, it is necessary to use the supporting substrate 8 capable of holding the carrier-transport material 11 therein and preventing infiltration of water or the like from the outside. In the case where the supporting substrate 8 serves as a light-receiving surface, the supporting substrate 8 is required to have optical transparency comparable to that of the transparent substrate. It is thus necessary to use the same material as that of the transparent substrate 1. For example, tempered glass is preferably used for the supporting substrate 8 in view of the case where the photoelectric conversion element is placed outdoors.

Preferably, the supporting substrate 8 (including the catalyst layer and the counter conductive layer when they are arranged on a surface) is not in contact with the photoelectric conversion layer 3 on the transparent substrate 1. It is thus possible to hold a sufficient amount of the carrier-transport material in the photoelectric conversion element. The supporting substrate 8 is preferably equipped with an inlet to inject the carrier-transport material. It is possible to inject the carrier-transport material through the inlet by a vacuum injection method, a vacuum impregnation method, or the like. The supporting substrate 8 is not in contact with the photoelectric conversion layer 3 on the transparent substrate 1. This results in an increase in injection rate when the carrier-transport material is injected through the inlet. It is thus possible to improve the production tact of the photoelectric conversion element and the photoelectric conversion element module.

<<Sealing Member>>

In the present invention, the sealing member 9 is arranged to bond the transparent substrate 1 to the supporting substrate 8. The sealing member 9 is preferably composed of a silicone resin, an epoxy resin, a polyisobutylene resin, a hot-melt resin, a glass-based material, or the like. The sealing member 9 may have a laminated structure containing two or more thereof.

Examples of a material contained in the sealing member 9 include Model 31X-101, manufactured by ThreeBond Co., Ltd., Model 31X-088, manufactured by ThreeBond Co., Ltd., and commonly-marketed epoxy resins. In the case where the sealing member 9 is formed of a silicone resin, an epoxy resin, or a glass frit, the sealing member 9 is preferably formed with a dispenser. In the case where the sealing member 9 is formed of a hot-melt resin, the sealing member 9 may be formed by forming a hole pattern in a sheet-like hot-melt resin.

<<Method for Forming Porous Semiconductor>>

A method for forming the porous semiconductor constituting the photoelectric conversion layer 3 on the transparent conductive layer 2 is not particularly limited. A known method may be employed. That is, for example, the porous semiconductor is formed by applying a suspension containing semiconductor fine particles suspended in an appropriate solvent to a predetermined site using a known method and performing at least one of drying and firing.

In the case where the photoelectric conversion layer 3 is formed so as to be in contact with the sealing member 9, it is preferred that the suspension be prepared so as to have a low viscosity and that the suspension be applied to a region divided by the sealing member 9 with a dispenser or the like. In this case, the paste spreads to an end portion of the region and levels easily under its own weight.

Examples of the solvent used for the suspension include glyme-based solvents, such as ethylene glycol monomethyl ether; alcohols, such as isopropyl alcohol; alcohol-based mixed solvents, such as isopropyl alcohol/toluene; and water. A commercially titanium oxide paste (for example, Ti-nanoxide T, D, T/SP, or D/SP, manufactured by Solaronix) may be used in place of the suspension.

After the resulting suspension is applied onto the transparent conductive layer 2, at least one of drying and firing is performed to form the porous semiconductor on the transparent conductive layer 2. As a method for applying the suspension, a known method, e.g., a doctor blade method, a squeegee method, a spin coating method, or a screen printing method, may be employed.

Conditions (for example, temperature, time, and an atmosphere) required for the drying or firing of the porous semiconductor may be appropriately set, depending on the type of semiconductor fine particles. For example, in the case where drying or firing is performed in an air atmosphere or in an inert gas atmosphere, drying or firing is preferably performed at about 50° C. to about 800° C. for about 10 seconds to about 12 hours. The drying or firing may be performed once at a temperature or twice or more at different temperatures.

The porous semiconductor may be formed of a laminate in which a plurality of layers are stacked. To form the laminate of the porous semiconductor, it is preferred that suspensions containing different semiconductor fine particles be prepared and that at least one of application, drying, and firing be repeated twice or more.

After the formation of the porous semiconductor in this way, post-treatment is preferably performed in order to improve the performance of the porous semiconductor. The post-treatment of the porous semiconductor results in improvement in the electrical connection between semiconductor fine particles, an increase in the surface area of the porous semiconductor, and a reduction in defect level on the semiconductor fine particles. For example, the porous semiconductor composed of titanium oxide is post-treated with an aqueous solution of titanium tetrachloride, thereby improving the performance of the porous semiconductor.

<<Formation of Porous Insulating Layer>>

Next, the porous insulating layer 4 is formed on the photoelectric conversion layer 3. The porous insulating layer 4 may be formed in the same way as the porous semiconductor. That is, an insulating substance in the form of the fine particles described above is dispersed in an appropriate solvent. A macromolecular compound, e.g., ethyl cellulose or polyethylene glycol (PEG), is mixed therewith to prepare a paste. The resulting paste is applied onto the photoelectric conversion layer 3. At least one of drying and firing is performed, thereby forming the porous insulating layer 4 on the photoelectric conversion layer 3.

<<Adsorption of Photosensitizer>>

Next, the photosensitizer is allowed to adsorb on the porous semiconductor to form the photoelectric conversion layer 3. A method for adsorbing the photosensitizer is not particularly limited. For example, a method in which the porous semiconductor is immersed in the foregoing dye adsorption solution may be employed. In this case, the dye adsorption solution may be heated in order to infiltrate the dye adsorption solution into the deep portions of micropores of the porous semiconductor.

As a solvent to dissolve the photosensitizer, any solvent may be used as long as it can dissolve the photosensitizer. Examples thereof include alcohols, toluene, acetonitrile, tetrahydrofuran (THF), chloroform, and dimethylformamide. A purified solvent is preferably used as the solvent. A mixture of two or more types of solvents may be used.

The concentration of the dye contained in the dye adsorption solution may be appropriately set, depending on the types of dye and solvent, conditions of a dye adsorption step, and so forth. To improve an adsorption function, a high concentration is preferred. For example, the concentration is preferably $1 \times 10^{-5}$ mol/L or more. When the dye adsorption solution is prepared, heating may be performed in order to improve the solubility of the dye.

<<Formation of Reflective Layer>>

The reflective layer 5 is formed on the resulting porous insulating layer 4 described above. As a method for forming the reflective layer 5, the same method as the method for forming the photoelectric conversion layer may be employed.

<<Photoelectric Conversion Element Module>>

Figure 2:
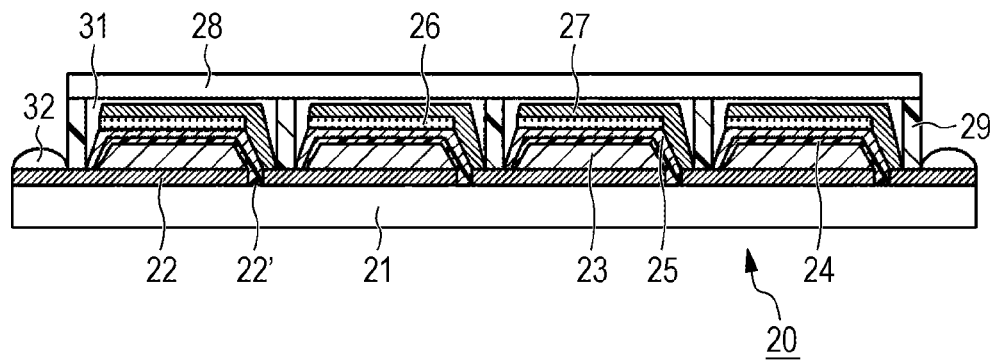
FIG. 2 is a schematic cross-sectional view of an example of the structure of a photoelectric conversion element module of the present invention.
Figure 3:
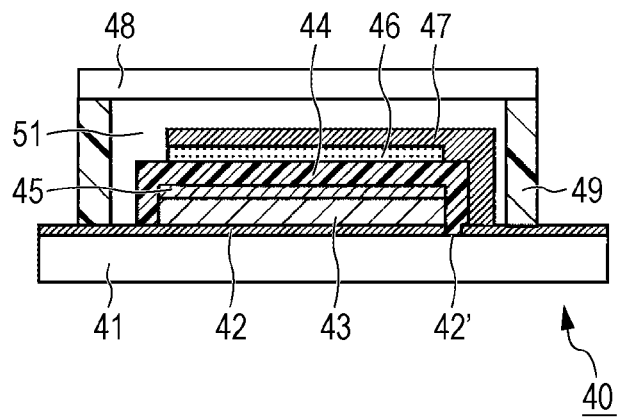
FIG. 3 is a schematic cross-sectional view of an example of the structure of a conventional photoelectric conversion element.

The present invention also provides a photoelectric conversion element module including two or more photoelectric conversion elements electrically connected in series, in which at least one of the two or more photoelectric conversion elements is the photoelectric conversion element of the present invention. FIG. 2 is a schematic cross-sectional view of an example of the structure of a photoelectric conversion element module of the present invention. A photoelectric conversion element module 20 in FIG. 2 is one in which four photoelectric conversion elements of the present invention are connected. As illustrated in FIG. 1, each of the photoelectric conversion elements includes a transparent substrate 21, a transparent conductive layer 22 on the transparent substrate 21, a photoelectric conversion layer 23 on the transparent conductive layer 22, a porous insulating layer 24 in contact with the photoelectric conversion layer 23, a reflective layer 25 in contact with the porous insulating layer 24, and a catalyst layer 26 on the reflective layer 25, in which the area of the orthogonal projection of the porous insulating layer 24 onto the transparent substrate 21 and the area of the orthogonal projection of the reflective layer 25 onto the transparent substrate 21 are each larger than the area of the orthogonal projection of the photoelectric conversion layer 23 onto the transparent substrate 21.

Gaps among the photoelectric conversion layer 23, the porous insulating layer 24, the reflective layer 25, and the catalyst layer 26 are filled with the carrier-transport material. A counter conductive layer 27 is arranged on the catalyst layer 26. The transparent substrate 21 is connected to a supporting substrate 28 with a sealing member 29. The transparent conductive layer 22 is partially broken. The broken portions are referred to as scribe lines 22'. Collector electrodes 32 are arranged at end portions of the transparent substrate 21.

The photoelectric conversion element module of the present invention is not limited to the module illustrated in FIG. 2. A module in which two or more photoelectric conversion elements are electrically connected in series and/or parallel is also included and does not depart from the present invention as long as at least one of two or more photoelectric conversion elements is a photoelectric conversion element of the present invention. The photoelectric conversion element module preferably includes three or more photoelectric conversion elements.

EXAMPLES

While the present invention will be described in more detail below by examples, the present invention is not limited to these examples. Hereinafter, thickness values of layers are determined by measurement with a surface roughness and texture measuring instrument (trade name: SURFCOM 1400A, manufactured by TOKYO SEIMITSU CO., LTD.) unless otherwise specified.

Example 1

In this example, the photoelectric conversion element 10 illustrated in FIG. 1 was produced. A 15 mm×40 mm×1.5 mm thick transparent electrode substrate (glass with a $SnO_2$ film, manufactured by Nippon Sheet Glass Company, Ltd) was prepared. The transparent electrode substrate includes the transparent conductive layer 2 composed of fluorine-doped $SnO_2$ on the transparent substrate 1 composed of glass.

The transparent conductive layer 2 on the transparent electrode substrate was cut by laser scribing to form the scribe line 2'. A commercially available titanium oxide paste (trade name: D/SP, manufactured by Solaronix) was applied onto the transparent conductive layer 2 with a screen printing machine (Model: LS-150, manufactured by Newlong Seimitsu Kogyo Co., Ltd.) using a screen plate having a 5 mm×30 mm pattern. Leveling was performed at room temperature for 1 hour.

The resulting coating film of the titanium oxide paste was dried in an oven set at 80° C. for 20 minutes. The resulting coating film was then fired with a firing furnace (Model: KDF P-100, manufactured by Denken Co., Ltd.) set at 500° C. in air for 60 minutes. The application and firing of the titanium oxide paste were repeated four times in the same way as described above, thereby producing a porous semiconductor having a thickness of 25 μm.

A paste containing zirconia particles with an average particle size of 50 nm was applied onto the porous semiconductor with a screen printing machine using a screen plate having a 7 mm×38 mm pattern. The paste was fired at 500° C. for 60 minutes to form the porous insulating layer 4 having a flat portion with a thickness of 4 μm. The electrical conductivity of the porous insulating layer 4 was measured with an impedance analyzer (product name: 1255 (manufactured by Solartron)) and found to be $2\times10^{13}$ Ω·cm.

A paste containing titanium oxide particles having an average particle size of 300 nm was applied with a screen plate having the same pattern as the screen plate used for the production of the porous insulating layer 4. The paste was fired at 500° C. for 60 minutes to form the reflective layer 5 having a flat portion with a thickness of 11 μm. Thus, the total thickness of the porous insulating layer 4 and the reflective layer 5 was 15 μm.

The catalyst layer 6 composed of Pt was formed by evaporation on a portion of the reflective layer 5 located directly above the porous semiconductor. The catalyst layer 6 had the same size as the porous semiconductor. The counter conductive layer 7 having a size of 9 mm×36 mm was formed by evaporation on the catalyst layer 6.

A dye (trade name: Ruthenium 620 1H3TBA, manufactured by Solaronix) represented by formula (2) was dissolved in a mixed solvent of acetonitrile and tert-butanol in a volume ratio of 1:1 to prepare a dye adsorption solution having a dye concentration of $4\times10^{-4}$ mol/L.

The foregoing porous semiconductor was immersed in the dye adsorption solution. The state was maintained at room temperature for 100 hours. Then the porous semiconductor was washed with ethanol and dried at about 60° C. for about 5 minutes to allow the dye to adsorb on the porous semiconductor. In this way, the photoelectric conversion layer 3 composed of the porous semiconductor on which the dye adsorbs.

As the supporting substrate 8, a 11 mm×40 mm glass substrate was used. The supporting substrate 8 and the transparent substrate 1 were bonded together using a heat-sealing film with an opening portion (Himilan 1702, manufactured by E.I. du Pont de Nemours and Company). Heating was performed in an oven set at about 100° C. for 10 minutes to press-bond the supporting substrate 8 and the transparent substrate 1. This heat-sealing film serves as the sealing member 9.

A carrier-transport material that has been previously prepared was injected through an inlet to inject an electrolytic solution, the inlet being arranged in the supporting substrate 8. A mixture containing acetonitrile serving as a solvent, LiI (manufactured by Aldrich) serving as a redox species in a concentration of 0.1 mol/L, $I_2$ (manufactured by KISHIDA CHEMICAL Co., Ltd.) serving as a redox species in a concentration of 0.01 mol/L, tert-butylpyridine (manufactured by Aldrich) serving as an additive in a concentration of 0.5 mol/L, and dimethylpropylimidazole iodide (manufactured by SHIKOKU CHEMICALS CORPORATION) serving as an additive in a concentration of 0.6 mol/L was prepared and used as the carrier-transport material.

The inlet to inject the electrolytic solution was sealed with an ultraviolet curable resin (Model: 31X-101 229, manufactured by ThreeBond Co., Ltd.), thereby completing a photoelectric conversion element (single cell) according to this example. A Ag paste (trade name: Dotite, manufactured by Fujikura Kasei Co., Ltd.) was applied to the transparent substrate 1 of the resulting photoelectric conversion element to form collector electrodes.

Examples 2 to 4

Photoelectric conversion elements of Examples 2 to 4 were produced as in Example 1, except that the thicknesses of the porous insulating layers were different from those in Example 1 as described in Table 1.

Example 5

A photoelectric conversion element of Example 5 was produced as in Example 1, except that the material of the porous insulating layer was changed to silicon oxide.

Example 6

A photoelectric conversion element of Example 6 was produced as in Example 1, except that the material of the reflective layer was changed to aluminum oxide.

Comparative Example 1

A photoelectric conversion element of Comparative Example 1 was produced as in Example 1, except that the reflective layer having the same size as the porous semiconductor was formed.

Example 7

In this example, a photoelectric conversion element module having the structure illustrated in FIG. 2 was produced. A 50-mm-long and 37-mm-wide transparent electrode substrate (glass with a $SnO_2$ film, manufactured by Nippon Sheet Glass Company, Ltd) was prepared. The transparent electrode substrate includes the transparent conductive layer 22 composed of $SnO_2$ on the transparent substrate 21 composed of glass.

The transparent conductive layer 22 was cut by laser scribing to form the scribe lines 22' arranged in parallel with one another in the longitudinal direction, each of the scribe lines 22' having a width of 60 µm. The scribe lines 22' were formed at four positions in total, the four positions being spaced at 7 mm intervals from a position 9.5 mm away from the left end portion of the transparent substrate 21.

A 30-mm-long, 5-mm-wide, and 25-µm-thick porous semiconductor was formed in the same way as in Example 1, the porous semiconductor being centered at a position away from 6.9 mm from the left end portion of the transparent substrate 21. Three porous semiconductors each having the same size were formed at 7 mm intervals from the position.

The porous insulating layers 24 were formed on the porous semiconductors as in the same way as in Example 1. A 46-mm-long and 5.6-mm-wide porous insulating layer 24 was formed so as to be centered at a position 6.9 mm away from the left end of the transparent substrate 21. Three porous insulating layers each having the same size were formed at 7 mm intervals from the center of this porous insulating layer 24.

The reflective layers 25 were formed on the porous insulating layers 24 in the same way as in Example 1. The catalyst layers 26 composed of Pt were formed on the reflective layers 25. Each of the catalyst layers 26 had the same position and the same size as a corresponding one of the porous semiconductors. The counter conductive layers 27 were formed in the same way as in Example 1. A 44-mm-long and 5.6-mm-wide counter conductive layer 27 was formed so as to be centered at a position 7.2 mm away from the left end portion of the transparent substrate 21. Three counter conductive layers 27 having the same size were formed at 7 mm intervals from the center of the leftmost porous insulating layer 24.

The four porous semiconductors were immersed in the dye adsorption solution used in the Example 1 and maintained at room temperature for 120 hours, thereby allowing the dye to adsorb on the porous semiconductors. An ultraviolet curable resin (31X-101, manufactured by ThreeBond Co., Ltd.) was applied between the photoelectric conversion layers 23 and around the transparent substrate 21 with a dispenser (ULTRASAVER, manufactured by EFD). The supporting substrate 28 formed of a 60-mm-long and 30-mm-wide glass substrate was bonded thereto and irradiated with ultraviolet rays using an ultraviolet lamp (NOVA-CURE, manufactured by EFD), thereby curing the ultraviolet curable resin to form the sealing member 29.

A carrier-transport material was injected in the same way as in Example 1. The inlet was sealed with the ultraviolet curable resin, thereby completing the photoelectric conversion element module of this Example. A Ag paste (trade name: Dotite, manufactured by Fujikura Kasei Co., Ltd.) was applied onto the transparent substrate of the photoelectric conversion element module to form collector electrode portions.

Example 8

The laminate of the photoelectric conversion element produced in Example 1 was cut in the series direction by laser scribing to divide the photoelectric conversion element into two photoelectric conversion elements. The resulting two photoelectric conversion elements were connected in parallel to produce a photoelectric conversion element module of this example.

Comparative Example 2

A photoelectric conversion element module of Comparative Example 2 was produced in the same way as in Example 7, except that the shape of the reflective layers was the same as that of the porous semiconductors and that the thicknesses of the porous insulating layers and the reflective layers were equal to those in Comparative Example 1.

<Solar Cell Characteristics of Photoelectric Conversion Elements of Examples 1 to 6 and Comparative Example 1>

A black mask having an opening portion with an area of 1.5 $cm^2$ was arranged on a light-receiving surface of each of the photoelectric conversion elements of Examples 1 to 6 and Comparative Example 1. A short-circuit current Jsc (mA/$cm^2$), an open voltage Voc (V), a fill factor (FF), and a photoelectric conversion efficiency (%) were measured by irradiating the light-receiving surface of each of the photoelectric conversion elements with light having an intensity of 1 kW/$m^2$ using AM 1.5 solar simulator. Table 1 illustrates the results.

<Solar Cell Characteristics of Photoelectric Conversion Elements of Examples 7 and 8 and Comparative Example 2>

A black mask having an opening portion with an area of 7.8 $cm^2$ was arranged on a light-receiving surface of each of the photoelectric conversion elements of Examples 7 and 8 and Comparative Example 2. A short-circuit current Jsc (mA/$cm^2$), an open voltage Voc (V), a fill factor (FF), and a photoelectric conversion efficiency (%) were measured by irradiating the light-receiving surface of each of the photoelectric conversion elements with light having an intensity of 1 kW/$m^2$ using AM 1.5 solar simulator. Table 1 illustrates the results.

TABLE 1

| | Porous insulating layer (µm) | Jsc (mA/$cm^2$) | Voc (V) | FF | Conversion efficiency (%) |
|---|---|---|---|---|---|
| Example 1 | 4 | 20.21 | 0.701 | 0.681 | 9.648 |
| Example 2 | 5 | 20.08 | 0.702 | 0.679 | 9.571 |
| Example 3 | 7 | 19.90 | 0.703 | 0.676 | 9.457 |
| Example 4 | 2 | 20.52 | 0.700 | 0.682 | 9.796 |
| Example 5 | 4 | 20.55 | 0.702 | 0.685 | 9.882 |
| Example 6 | 4 | 20.31 | 0.701 | 0.680 | 9.681 |
| Comparative Example 1 | 4 | 19.20 | 0.602 | 0.305 | 3.525 |
| Example 7 | 4 | 4.31 | 2.831 | 0.665 | 8.11 |
| Example 8 | 4 | 4.21 | 2.835 | 0.660 | 7.88 |
| Comparative Example 2 | 4 | 3.86 | 2.840 | 0.658 | 7.21 |

In Table 1, a comparison of the photoelectric conversion elements of Examples 1 to 6 with the photoelectric conversion element of Comparative Example 1 demonstrates the following: In Examples 1 to 6, the area of the orthogonal projection of the photoelectric conversion layer 3 onto the transparent substrate 1 is smaller than the area of the orthogonal projection of each of the porous insulating layer 4 and the reflective layer 5, thereby improving the short-circuit current density and the photoelectric conversion efficiency. In the photoelectric conversion element of Comparative Example 1, the photoelectric conversion layer 3 and the reflective layer 5 are the same in size, thereby reducing the light-scattering effect. Furthermore, in Comparative Example 1, a short circuit occurred to reduce the fill factor and the photoelectric conversion efficiency presumably because of the insufficient thickness of each of the porous insulating layer and the reflective layer, which were portions other than the photoelectric conversion layer.

A comparison of the dye-sensitized solar cell modules of Examples 7 to 8 with that of Comparative Example 2 also leads to the same conclusion as the comparison of Examples 1 to 6 and Comparative Example 1.

While the embodiments and examples of the present invention have been described as above, proper combinations of the structures of the embodiments and examples are planned from the outset.

It should be understood that the embodiments and the examples disclosed herein are illustrative and not limitative in any respect. The scope of the present invention is defined by the terms of the claims, rather than the description of the embodiments above, and is intended to include any modifications within the scope and meaning equivalent to the terms of the claims.

REFERENCE SIGNS LIST 1, 21, 41 transparent substrate, 2', 22' scribe line, 2, 22, 42 transparent conductive layer, 3, 23 photoelectric conversion layer, 4, 24, 44 porous insulating layer, 5, 25, reflective layer, 6, 26, 46 catalyst layer, 7, 27, 47 counter conductive layer, 8, 28, 48 supporting substrate, 9, 29, 49 sealing member, 10, 40 photoelectric conversion element, 11, 51 carrier-transport material, 20 photoelectric conversion element module, 32 collector electrode, 43 porous semiconductor

The invention claimed is:

1. A photoelectric conversion element comprising:
a transparent substrate;
a transparent conductive layer arranged on the transparent substrate;
wherein the transparent conductive layer comprises two regions separated by a scribe line;
a photoelectric conversion layer arranged on the transparent conductive layer;
a porous insulating layer arranged in contact with the photoelectric conversion layer and covering a top surface of the photoelectric conversion layer and a side surface of the photoelectric conversion layer;
the porous insulating layer extending into the into the scribe line separating the two regions of transparent conductive layer and over a top horizontal surface of the two regions of the transparent conductive layer;
a reflective layer arranged in contact with the porous insulating layer and covering a whole of a top surface of the porous insulating layer; and
a catalyst layer and a counter conductive layer that are arranged on the reflective layer;
wherein the photoelectric conversion layer comprises:
a porous semiconductor,
a carrier-transport material, and
a photosensitizer,
wherein the photoelectric conversion layer, the porous insulating layer and the reflective layer are laminated in that order,
wherein the reflective layer is thicker than the porous insulating layer,
wherein the porous insulating layer comprises one or more compounds selected from the group consisting of niobium oxide, zirconium oxide, silicon oxide compounds, aluminum oxide, and barium titanate,
wherein the reflective layer comprises aluminum oxide or titanium oxide, and
wherein the porous insulating layer has an orthogonal projection onto the transparent substrate, the orthogonal projection of the porous insulating layer onto the transparent substrate having an area,
the reflective layer has an orthogonal projection onto the transparent substrate, the orthogonal projection of the reflective layer onto the transparent substrate having an area,
the photoelectric conversion layer has an orthogonal projection onto the transparent substrate, the orthogonal projection of the photoelectric conversion layer onto the transparent substrate having an area, and
the area of the orthogonal projection of the porous insulating layer onto the transparent substrate and the area of the orthogonal projection of the reflective layer onto the transparent substrate are each larger than the area of the orthogonal projection of the photoelectric conversion layer onto the transparent substrate.

2. The photoelectric conversion element according to claim 1, wherein the porous insulating layer is arranged in contact with an upper portion and side surfaces of the photoelectric conversion layer, and wherein the reflective layer is arranged in contact with an upper portion of the porous insulating layer.

3. The photoelectric conversion element according to claim 1, wherein the porous insulating layer has a thickness of 0.2 μm or more and 5 μm or less.

4. The photoelectric conversion element according to claim 1, wherein the total thickness of the porous insulating layer and the reflective layer is 10 μm or more.

5. The photoelectric conversion element according to claim 1, wherein the porous insulating layer comprises a material having an electrical conductivity of $1 \times 10^{12}$ Ω·cm or less.

6. The photoelectric conversion element according to claim 1, wherein the reflective layer comprises a material identical to a material constituting the porous semiconductor.

7. The photoelectric conversion element according to claim 1, wherein the reflective layer and the porous semiconductor are comprised of titanium oxide.

8. The photoelectric conversion element according to claim 1, wherein the reflective layer is formed of fine particles having an average particle size larger than the average particle size of fine particles constituting the porous semiconductor.

9. A photoelectric conversion element module comprising two or more photoelectric conversion elements electrically connected in series, wherein at least one of the photoelectric conversion elements is the photoelectric conversion element according to claim 1.

10. A photoelectric conversion element module comprising three or more photoelectric conversion elements electrically connected in series and/or parallel, wherein at least one of the photoelectric conversion elements is the photoelectric conversion element according to claim 1.

11. A photoelectric conversion element module comprising two or more photoelectric conversion elements electrically connected in series and/or parallel, wherein each of the photoelectric conversion elements is the photoelectric conversion element according to claim 1.

12. The photoelectric conversion element according to claim 1, wherein the reflective layer has a side surface uncovered by the counter conductive layer.

* * * * *